United States Patent [19]

Flowers

[11] 3,876,461

[45] Apr. 8, 1975

[54] SEMICONDUCTOR PROCESS

[75] Inventor: Dervin L. Flowers, Scottsdale, Ariz.

[73] Assignee: Motorola, Inc., Chicago, Ill.

[22] Filed: Sept. 4, 1973

[21] Appl. No.: 394,228

[52] U.S. Cl. .............. 117/213; 117/47 A; 117/113; 117/201; 117/227

[51] Int. Cl. .......................... B44d 1/20; B44d 1/092

[58] Field of Search ......... 117/201, 213, 227, 47 A, 117/62.1, 113; 357/72; 29/588

[56] References Cited

UNITED STATES PATENTS

| | | | |
|---|---|---|---|
| 3,619,243 | 11/1971 | Brindisi | 117/47 A |
| 3,698,940 | 10/1972 | Mersereau | 117/213 |
| 3,791,986 | 2/1974 | Mallico | 117/47 A |
| 3,808,028 | 4/1974 | Lando | 117/213 |

*Primary Examiner*—Michael F. Esposito
*Attorney, Agent, or Firm*—Vincent J. Rauner; Henry T. Olsen

[57] ABSTRACT

A process for improving the reliability and solderability characteristics of plastic encapsulated semiconductor devices which includes the step of immersing the devices in N-methyl-2-pyrollidone.

4 Claims, No Drawings

SEMICONDUCTOR PROCESS

BACKGROUND OF THE INVENTION

This invention relates to the manufacture of semiconductor devices and more particularly to the manufacture of plastic encapsulated semiconductor devices.

In a conventional method of manufacturing semiconductor devices, and particularly integrated circuits, the semiconductor chip or die is mounted on a lead frame. The lead frame has a support pad for the die and a plurality of fingers which provide the electrical terminals for the device. Following suitable bonding between portions of the semiconductor device and the fingers of the lead frame, the lead frame and the semiconductor chip is encapsulated in a molded plastic package. The tie bar portions of the lead frame are then removed to form separated electrical terminals for the finished device. Residues or "flash" from the encapsulation process may coat the electrical terminals, the heat from the encapsulation may oxidize the leads or other contaminants from the encapsulation process may so coat the terminals as to destroy electric continuity to the semiconductor device therein and/or may not permit the package to be reliably soldered into a circuit. Various steps have been utilized to overcome this problem, one of the most common being a mechanical sandblast of the device. Also certain chromic acid or dimethyl formamide solvents have been suggested. However, a problem encountered with most solvent type processes is that the solvent in cleaning up the parts also attacks the material from which the package is formed leading to either defective packages or at least packages which appear defective from a cosmetic standpoint.

It is therefore an object of this invention to provide an improved semiconductor process for the flash removal of plastic encapsulated devices.

A further object of the invention is to provide an improved process for cleaning and improving the plating and hence solderability of the leads for semiconductor devices.

N-methyl-2-pyrollidone is a highly polar aprotic liquid which is widely employed as a chemical reaction medium. A listing of its many suggested uses is found in M-PYROL (N-methyl-2-pyrollidone) Handbook published by GAF Corporation (1972). Its various physical property data is set forth therein.

It is a further object of this invention to provide an improved process for the manufacture of semiconductor devices utilizing N-methyl-2-pyrollidone.

SUMMARY OF THE INVENTION

In accordance with the invention there is provided an improved method for the manufacture of plastic encapsulated semiconductor devices which includes the step of immersing an encapsulated semiconductor device in N-methyl-2-pyrollidone for 1 to 20 minutes at a temperature between 70° and 110°C. Following immersion the semiconductors are rinsed with water to remove the excess. The parts appear to be coated with an absorbed monolayer of the N-methyl-2-pyrollidone, while removing contaminants during the immersion process. The solution may contain a surfactant such as a sulfosuccinate ester.

Further objects and advantages will be noted in the following complete description thereof of the preferred process in accordance with the invention.

COMPLETE DESCRIPTION

As in a conventional method of manufacturing semiconductor devices, and particularly integrated circuits, a semiconductor chip or die is mounted on a lead frame. The lead frame has a support pad for the die and a plurality of fingers which provide the electrical terminals for the device. Following forming of suitable bonding wires between portions of the semiconductor device and the fingers of the lead frame, the lead frame and the semiconductor chip is encapsulated in a molded plastic package.

The molding of plastic semiconductor devices can result in excess flash that is difficult to remove. The result is that the parts may be tested as open circuits because of a thin film on the leads. Also plating and solder rejects can be common since the film of flash will not accept the plating material. Mechanical deflashing such as the use of polycarbonate particles in a sand blaster will remove the flash between the leads but not always the thin film flash on the leads. The use of sand in a sandblaster may remove the thin film but the mechanical damage to the leads that results can seriously perturb both reliability and appearance of the semiconductor devices. Various chemical strippers have been tried with a certain amount of success but such strippers, for example, chromic acid, phenol-dichlorobenzene or dimethyl formamide can be absorbed into the plastic putting alkali, halogen, or acidic contamination into the plastic matrix.

The foregoing problems have been discovered to be largely overcome by immersion of encapsulated transistor packages immediately after molding in N-methyl-2-pyrollidone for 1 to 20 minutes. The N-methyl-2-pyrollidone is non-corrosive and non-toxic with a high polarity (Dipole Moment of 4.09D). The solution apparently functions by destroying on thin film only the chemisorption bonds between the metal and the plastic flash thus lifting the flash from the metal leads rather than dissolving the flash. Obviously a solution which operated by dissolving the flash would also begin to attack the packaging material. Following the immersion in the methyl pryollidone bath, held at a temperature of approximately 100°C for 5 minutes, the parts are rinsed in water at a temperature of 70° to 80°C for 15 to 20 seconds. Following this treatment devices which required hand removal of flash was less than 5/10 of 1 percent which is in the order of magnitude better than previous experience with the mechanical deflashing.

Addition of 0.5 percent of a dioctyl-sulfosuccinate permits the time of immersion to be reduced to 2 minutes and the temperature of the bath to 80°C.

The improved solderability of the devices following the N-methyl-2-pyrollidone treatment is but one of the advantages of the treatment. While the exact reason is not clear results from testing have shown improved reliability of devices treated, perhaps because of absorbed N-methyl-2-pyrollidone in the plastic whether the plastic is phenolic, epoxy, or silicone. Thus while the N-methyl-2-pyrollidone does not attack the plastic it appears to be absorbed into the surface leading to higher reliability. A group of epoxy encapsulated integrated circuits having been immersed in the methyl-pyrollidone for 5 minutes at 80°C were THB (Temperature-Humidity-Bias) tested at 80°C with 85 percent humidity while another group of untreated devices of the same type were tested under the same conditions. The untreated group reached a 10 percent failure rate in 30 hours while the 10 percent failure rate for the N-methyl-2-pyrollidone treated group took 110 hours to reach the 10 percent failure rate.

In another group of phenolic encapsulated integrated circuits the untreated group reached a 10 percent failure rate in 110 hours while the group treated with the N-methyl-2-pyrollidone reached the 10 percent failure rate in 200 hours. It is thus seen there is provided an approved method for treating semiconductor devices to improve their reliability. While the invention has been disclosed by way of the preferred embodiment thereof suitable modifications may be made therein without departing from the spirit and scope of the invention.

What is claimed is:

1. In a process of manufacturing a semiconductor device wherein a semiconductor chip is mounted on a lead frame and a plastic encapsulation is molded therearound, the improvement comprising the step of:

immersing the device in a solution of N-methyl-2-pyrollidone heated to 70°–110°C for a period of 1–20 minutes.

2. A process as recited in claim 1 wherein the plastic is selected from the group consisting of phenolics, silicones and epoxies.

3. A process as recited in claim 2 wherein the immersion time is 5 minutes.

4. A process as recited in claim 1 wherein said solution also contains a surfactant.

* * * * *